(12) United States Patent
Ohki et al.

(10) Patent No.: US 7,504,765 B2
(45) Date of Patent: Mar. 17, 2009

(54) PIEZOELECTRIC TRANSFORMER AND THE METHOD FOR MANUFACTURING THE SAME

(75) Inventors: Hiroshi Ohki, Osaka (JP); Yasuhiro Tsukada, Osaka (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 0 days.

(21) Appl. No.: 11/635,604

(22) Filed: Dec. 8, 2006

(65) Prior Publication Data

US 2007/0138919 A1 Jun. 21, 2007

(30) Foreign Application Priority Data

Dec. 19, 2005 (JP) .............................. 2005-364789

(51) Int. Cl.
*H01L 41/107* (2006.01)
(52) U.S. Cl. ...................................................... 310/359
(58) Field of Classification Search ................. 310/359
See application file for complete search history.

(56) References Cited

U.S. PATENT DOCUMENTS

| 5,365,141 | A | | 11/1994 | Kawai et al. |
| 5,998,909 | A | * | 12/1999 | Kumasaka et al. .......... 310/348 |
| 6,294,878 | B1 | * | 9/2001 | Murata et al. .......... 315/209 PZ |
| 2007/0120441 | A1 | | 5/2007 | Matsuo et al. |

FOREIGN PATENT DOCUMENTS

| JP | 9-186373 | * | 7/1997 |
| JP | 9-214011 | * | 8/1997 |
| JP | 9-246619 | * | 9/1997 |
| JP | 11-307837 | * | 11/1999 |
| JP | 2001-127355 | * | 5/2001 |
| JP | 2005-196547 | A | | 7/2005 |
| JP | 2005-270812 | A | | 10/2005 |
| WO | WO-2005/034323 | A1 | | 4/2005 |

* cited by examiner

*Primary Examiner*—Thomas M Dougherty
(74) *Attorney, Agent, or Firm*—Birch, Stewart, Kolasch & Birch, LLP

(57) ABSTRACT

A small, thin, light piezoelectric transformer capable of large-capacity output is provided at low cost. In piezoelectric transformers adjacent to each other in the row direction, a lower electrode extends in the column direction in a supporting substrate, so as to connect a plurality of piezoelectric transformers arranged in the column direction. Referring to FIGS. 2(*a*) and 2(*b*) as well, the piezoelectric substrates of the piezoelectric transformers adjacent to each other in the row direction are connected via the lower electrode or an upper electrode wire that collectively connects the piezoelectric transformers arranged in the column direction. Meanwhile, the piezoelectric substrates of the piezoelectric transformers adjacent to each other in the column direction are connected via a right electrode wire or a left electrode wire that collectively connects the piezoelectric transformers arranged in the row direction. With this structure, by applying a voltage between the cross right electrode wire or left electrode wire and the upper electrode wire or the lower electrode that crosses the wires, it becomes possible to gain access to an arbitrary set (pair) of piezoelectric transformers. Note that, upon access, four piezoelectric transformers adjacent to one another in the row and column directions are operated. While it goes without saying that more piezoelectric transformers can be operated by applying a voltage to the electrodes, operation is based on a set of four piezoelectric transformers.

6 Claims, 6 Drawing Sheets

US 7,504,765 B2

PIEZOELECTRIC TRANSFORMER AND THE METHOD FOR MANUFACTURING THE SAME

BACKGROUND OF THE INVENTION

1. Field of the Invention

The present invention relates to a piezoelectric transformer used for various types of power supplies. Particularly, it relates to a small-sized, thin-formed, and light-weight power supply capable of a large-capacity output.

2. Background Art

Conventionally, a wire-wound type electromagnetic transformer has been used as a transformer device used in electronic instruments such as various types of household electrical appliances or audio visual systems. Since such electromagnetic transformer is structured by winding a lead wire around a magnetic core, it is necessary to increase the number of lead wires to be wound for realizing a high transformation ratio. In addition, it has been very difficult to realize a small-sized, thin-formed electromagnetic transformer due to the need to assure a withstand voltage.

In contrast to such electromagnetic wound transformer, a piezoelectric transformer has been proposed (see Patent Document 1). This piezoelectric transformer has a principle of operation utterly different from that of the conventional electromagnetic transformer. FIG. 5 shows a perspective view of a structure of a single plate type piezoelectric transformer, which is what is called a Rosen-type piezoelectric transformer. The structure of such piezoelectric transformer will be hereafter described with reference to the drawing.

The portion provided with planar electrodes 35 on the top and bottom surfaces of a piezoelectric body refers to a driving portion 4, and it is polarized in the thickness direction thereof. Further, the portion sandwiched between an end face electrode 36 provided on an end portion of the piezoelectric body and the driving portion 4 is a power-generating portion 8, and it is polarized in the length direction thereof. In the piezoelectric transformer with such structure, a support 40 is attached to a node point during resonance of longitudinal vibration with respect to the length direction, and it is fixed to a transformer substrate (not shown). In this state, by applying an alternating voltage having a resonance frequency of the longitudinal vibration with respect to the length direction of the piezoelectric body between an external input electrical terminal 37 connected to the upper planar electrode and an external common electrical terminal 38 connected to the lower planar electrode, a voltage is generated between the external common electrical terminal 38 and an external output electrical terminal 39 connected to the end face output electrode 36. However, the piezoelectric transformer with such single plate structure as shown in FIG. 5 has an output current of on the order of several mA. Thus, it is not suitable for a power supply such as an AD adapter that requires an output current of on the order of several A.

Use of a piezoelectric transformer having a multilayer structure has been a means of making a piezoelectric transformer capable of large-capacity output. For example, Patent Documents 2 and 3 disclose such piezoelectric transformer having a multilayer structure. In the technology disclosed in Patent Document 2, a step-down voltage is generated by generating vibration in the length direction of a power-generating portion in conjunction with vibration in the length direction of a driving portion. An alternating voltage having a primary resonance frequency with respect to the length direction is applied to the driving portion via an external input electrical terminal, and a step-down voltage is generated at the power-generating portion via an external output electrical terminal. The technology disclosed in Patent Document 3 is characterized in that an alternating voltage having a tertiary resonance frequency is applied.

Patent Document 1: U.S. Pat. No. 2,830,274

Patent Document 2: JP Patent Publication (Kokai) No. 8-153914 A (1996)

Patent Document 3: JP Patent Publication (Kokai) No. 5-235432 A (1993)

SUMMARY OF THE INVENTION

However, the above-described technologies have the following problems. With multilayer ceramics used in the conventional piezoelectric transformer with a multilayer structure, it is necessary to establish a structure in which piezoelectric bodies and internal electrodes are alternatively stacked, thereby complicating the manufacturing process.

Further, since the piezoelectric bodies and internal electrodes are burned all together after they are alternatively stacked in the process for manufacturing multilayer ceramics, measures, such as addition of expensive palladium (Pd) to silver (Ag) for improving heat resistance, are necessary, thereby increasing the cost of material.

It is an object of the invention to provide a piezoelectric transformer that can be made smaller, thinner, and capable of large-capacity output at low cost.

In one aspect, the present invention provides a piezoelectric transformer having a supporting substrate and a piezoelectric body element. The piezoelectric body element is formed on the surface of the supporting substrate and has a piezoelectric body layer that expands or contracts in the thickness direction thereof when a voltage is applied thereto and that generates a voltage when a compressive force is added thereto. The piezoelectric transformer is characterized in that the piezoelectric body layer is formed on the surface of the supporting substrate.

An electromagnetic transformer that is difficult to be made smaller and thinner in principle is not used, but a piezoelectric transformer that is suitable for being made smaller or thinner is used. Further, in order to realize the piezoelectric transformer capable of large-capacity output, it is necessary to increase the cross-sectional area of the transformer. In the present invention, such piezoelectric transformers are arranged on a plane and connected in parallel.

The supporting substrate is provided with first piezoelectric body elements having a first vibration direction and second piezoelectric body elements having a second vibration direction that crosses the first vibration direction. Further, the first and second piezoelectric body elements are alternatively provided in the plane of the supporting substrate. In this way, influence of vibration of the substrate associated with vibration of the piezoelectric transformers is cancelled, thereby realizing improvement in device reliability and reduction in vibration damage. These piezoelectric transformers are connected in parallel and individual piezoelectric transformers are synchronized by a synchronous circuit, so that a large-capacity electric power of a desired voltage is outputted.

Also, the invention is characterized in that the vibration direction of one piezoelectric body is opposite to the vibration direction of its adjacent piezoelectric body. Preferably, the piezoelectric body element includes a driving-portion side piezoelectric body layer and a power-generating portion side piezoelectric body layer connected to the driving-portion side piezoelectric body layer in a plane direction of the supporting substrate, the driving-portion side piezoelectric body layer is provided with an upper electrode and a lower electrode to which a voltage is applied in the thickness direction of the driving-portion side piezoelectric body layer, and the power-generating portion side piezoelectric body layer is provided with a left electrode and a right electrode on side surfaces that cross the thickness direction. In this way, it becomes possible to perform piezoelectric conversion with respect to distortion generated at the driving portion, so as to generate an output voltage between the left electrode and the right electrode.

It is preferable that one end of the right electrode or the left electrode is fixed to a side wall, and the other end thereof is set free without being supported on the side wall. In this way, vibration that influences the supporting substrate or the like can be reduced.

In another aspect, the present invention provides a piezoelectric transformer wherein many piezoelectric elements are arranged in the row and column directions in a two-dimensional plane. The piezoelectric transformer has a first wire extending in the column direction for connecting the driving-portion side piezoelectric body layers of the piezoelectric elements arranged in the column direction in a first plane, a second wire extending in the column direction for connecting the driving-portion side piezoelectric body layers of the piezoelectric elements arranged in the column direction in a second plane that is opposite to the first plane, and third and fourth wires extending in the row direction for connecting the power-generating portion side piezoelectric body layers, which are connected to the driving-portion side piezoelectric body layers in the column direction, on side surfaces that cross the thickness direction of the power-generating portion side piezoelectric body layers.

Preferably, the first and second wires connect piezoelectric elements adjacent to each other in the row direction, and they collectively connect piezoelectric elements arranged in the column direction. The third and fourth wires connect piezoelectric elements adjacent to each other in the column direction, and they collectively connect piezoelectric elements arranged in the row direction.

Based on such structure, it becomes possible to gain access to an arbitrary set (pair) of piezoelectric transformers by applying a voltage between electrode wires. Note that, upon access, at least four piezoelectric transformers that are adjacent to one another in the row and column directions are operated.

In another aspect, the present invention provides a method for manufacturing the piezoelectric transformer. The method includes: a step of forming a sacrifice layer on the supporting substrate; a step of forming a first electrode structure on the sacrifice layer; a step of forming a piezoelectric body deposited film on the first electrode structure; a step of processing the piezoelectric body deposited film in the shape of an island; and a step of forming a second electrode structure on the position opposite to the first electrode structure of the island-shaped piezoelectric body deposited film and forming third and fourth electrode structures at positions in a direction that crosses the above opposing direction. It is difficult to use ceramics as used in conventional technologies to arrange piezoelectric transformers on a plane. In the present invention, a piezoelectric thin film obtained by depositing piezoelectric material is used. Further, the deposited film of the piezoelectric transformer is formed through a semiconductive method such as a sputtering process, chemical vapor deposition, or a sol-gel method, and it is patterned through photolithography and etching, for example.

A parallel-connected, large-capacity output transformer of the present invention is made smaller and thinner than a conventional transformer utilizing an electromagnetic coil.

Further, the present invention provides a parallel-connected piezoelectric transformer that can realize large-capacity output.

Further, the method for manufacturing such piezoelectric transformer is simpler than conventional methods for manufacturing piezoelectric transformers, and material cost can be kept lower. Thus, the present invention can provide a method for manufacturing piezoelectric transformers at low cost.

BRIEF DESCRIPTION OF THE DRAWINGS

FIG. 2 shows a structure of a piezoelectric transformer according to the embodiment, wherein

FIG. 4 schematically shows vibration directions of the piezoelectric transformers connected in parallel according to the present embodiment, wherein

DESCRIPTION OF PREFERRED
EMBODIMENTS OF THE INVENTION

Figure 1A:
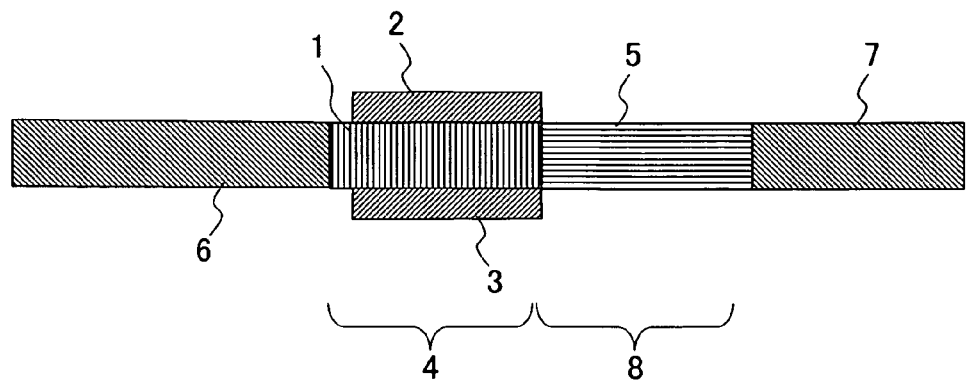
FIG. 1 shows a basic structure of a piezoelectric body according to an embodiment of the present invention.

First, a piezoelectric transformer according to an embodiment of the present invention will be described with reference to the drawings. A piezoelectric transformer according to the present embodiment is a parallel-connected, large-capacity output transformer. FIG. 1 shows a basic structure of a piezoelectric body according to the present embodiment. As shown in FIG. 1A, a driving-portion side piezoelectric body 1, which is to be a driving portion 4, and a power-generating portion side piezoelectric body 5, which is to be a power-generating portion 8, are formed of piezoelectric material, using a semiconductive method such as the sputtering process, the MOCVD (Metal Organic Chemical Vapor Deposition) method, the MBE (Molecular Beam Epitaxy) method, the sol-gel method, or the AD (Aerosol Deposition) method, and they are patterned into desired shapes by known photolithography and etching technologies.

Further, orientation of the driving-portion side piezoelectric body 1 and the power-generating portion side piezoelectric body 5 formed so that it is connected to the driving-portion side piezoelectric body 1 in a direction that crosses the thickness direction thereof, are controlled in their desired orientation of directions. In one example of a method for controlling orientation, depending on the difference in base, the direction of orientation of piezoelectric material deposited on the base can be made different, for example. The piezoelectric transformer utilizes a piezoelectric thin film (the thickness of the film is approximately 20 mm). While a solid solution consisting of lead zirconate ($PbZrO_3$) and lead titanate ($PbTiO_3$) is well-known as such piezoelectric material, it is preferable to use a non-Pb piezoelectric material that does not contain Pb, such as barium titanate ($BaTiO_3$) or potassium neonate ($KNbO_3$), from the viewpoint of environmental concerns. In one example of a method for controlling orientation, depending on the difference in base, the direction of orientation of piezoelectric material deposited on the base can be made different, for example.

The driving-portion side piezoelectric body 1 is provided with an upper electrode 2 and a lower electrode 3 on the top surface and the bottom surface in the thickness direction of the body 1, respectively, and an input voltage is applied between the upper electrode 2 and the lower electrode 3. Further, the power-generating portion side piezoelectric body 5 is provided with a left electrode 6 and a right electrode 7 on side surfaces that cross to the thickness direction. Piezoelectric conversion is performed with respect to distortion generated at the driving portion 4, so as to generate an output voltage between the left electrode 6 and the right electrode 7. For example, platinum (Pt), ruthenium (Ru), or iridium (Ir) may be used as a material for the electrodes. While cost per gram of these materials for the electrodes is high, manufacturing can be implemented at low cost since the film thickness can be made as thin as several hundred nm. For example, while the prices of Ag, Pd, and Pt are about 30 yen/g, about 700 yen/g, and about 3000 yen/g, since the film thickness of the electrode according to the present embodiment is about one several hundredths of a conventional piezoelectric body, even when Pd or Pt is used, practically, manufacturing can be implemented at low cost, compared with an element having a conventional structure utilizing Ag.

Figure 1B:
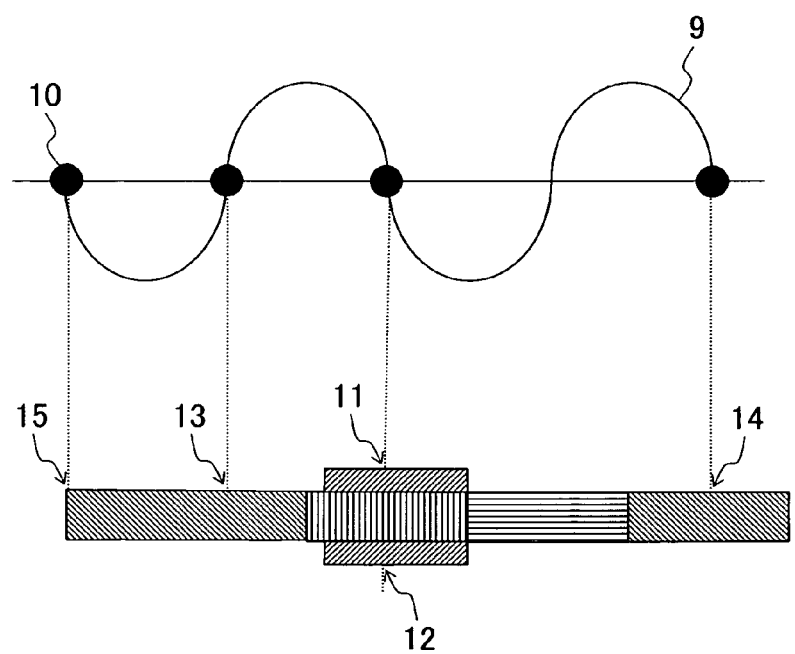

Meanwhile, as shown in FIG. 1B, the piezoelectric body including the driving portion 4 and the power-generating portion 8 is held at vibration node points 10, and conversion loss associated with vibration is suppressed. For example, during mechanical vibration 9 as shown in FIG. 1B, in order to suppress conversion loss associated with vibration, supports (not shown) are provided at a supporting point 11 on the upper electrode 2, a supporting point 12 on the lower electrode 3, a supporting point 13 on the left electrode 6, and a supporting point 14 on the right electrode 7, which correspond to the vibration node points 10 as indicated with black circles (●) (the vibration node points 10 are determined based on a driving frequency). Further, in order to regulate the direction of vibration to be one direction, one end face 15 of the piezoelectric body is fixed at one of the node points. 10. Note that when vibration is small during transformation (when output capacity is small), one end face of the piezoelectric body does not need to be fixed; whether it should be fixed must be determined based on the device specification of a person skilled in the art.

Figure 2A:
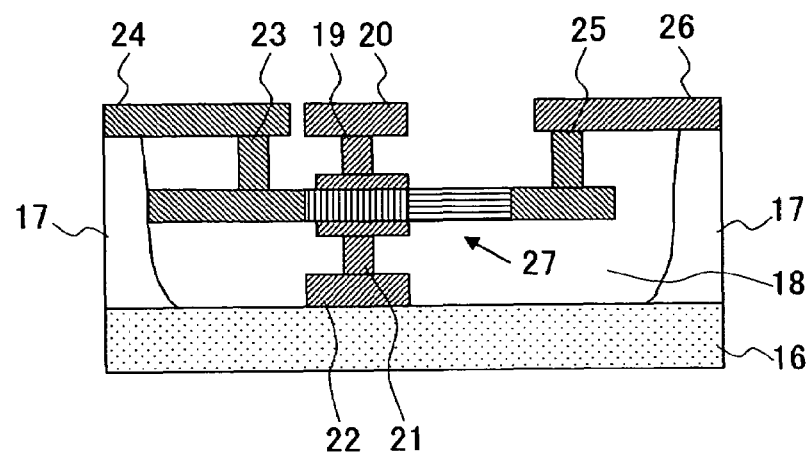
FIG. 2A shows a cross-sectional view taken along IIa-IIb line of FIG. 3B.
Figure 2B:
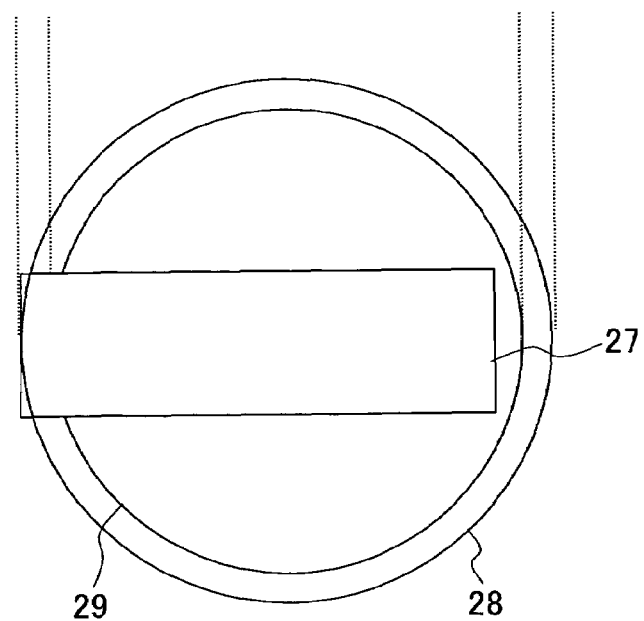
FIG. 2B shows a top view.

FIG. 2 shows an example of a structure of the piezoelectric transformer according to the present embodiment. FIG. 2A shows a cross-sectional view of the piezoelectric transformer (a cross-sectional view taken along IIa-IIb line of FIG. 3B to be described later). An insulating layer 17 is deposited on a supporting substrate 16, preferably on a semiconductor substrate, and air gap 18 is provided in a desired location of the insulating layer 17. A piezoelectric substrate 27 (including the driving-portion side piezoelectric body 1, the power-generating portion side piezoelectric body 5, the left electrode 6, and the right electrode 7) of the piezoelectric body is electrically connected to an upper electrode wire 20, a lower electrode wire 22, a left electrode wire 24, and a right electrode wire 26 via through holes 19, 21, 23, and 25 corresponding to the node point 11 on the upper electrode 2, the node point 12 on the lower electrode 3, and the node point 13 on the left electrode 6, and the node point 14 on the right electrode 7, respectively, as shown in FIGS. 1A and 1B. The piezoelectric substrate 27 is physically held by such wires. Further, while an end portion of the left electrode 6 is fixed to a side wall of the insulating layer 17, an end portion of the right electrode 7 is set free without being supported by the side wall of the insulating layer 17. FIG. 2B shows a top view of the piezoelectric transformer, and the piezoelectric substrate 27 including the driving-portion side piezoelectric body 1, the power-generating portion side piezoelectric body 5, the left electrode 6, and the right electrode 7 is arranged so that it has the positional relationship as shown in FIG. 2B with respect to an upper outline 28 (the outline of the upper end portion of the insulating layer 17), and the bottom outline 29 (the outline of the bottom end portion of the insulating layer 17) of the air gap 18, as described with reference to FIG. 2A.

In the method for manufacturing the structure shown in FIG. 2A, a sacrifice film is formed from a lower layer to an upper layer on the supporting substrate 16, so as to form the structure of each layer. Next, an opening can be formed after the step of wiring is finished.

Figure 3A:
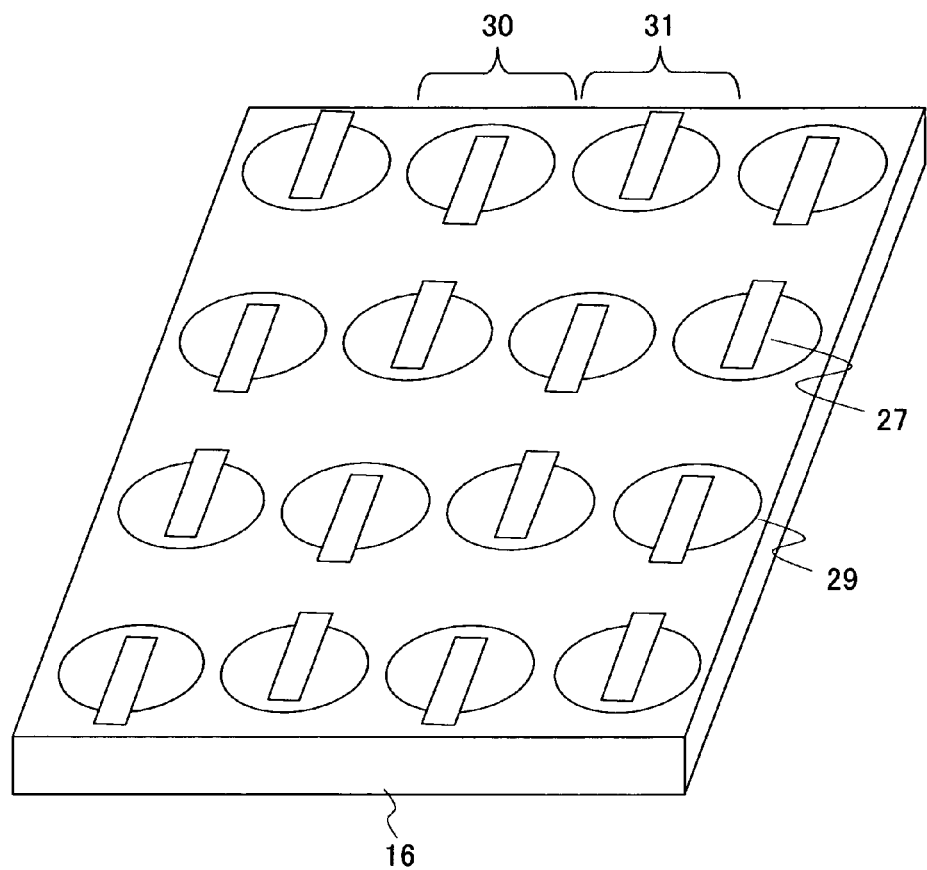
FIG. 3A shows a perspective view of the piezoelectric transformers connected in parallel according to the present embodiment.
Figure 3B:
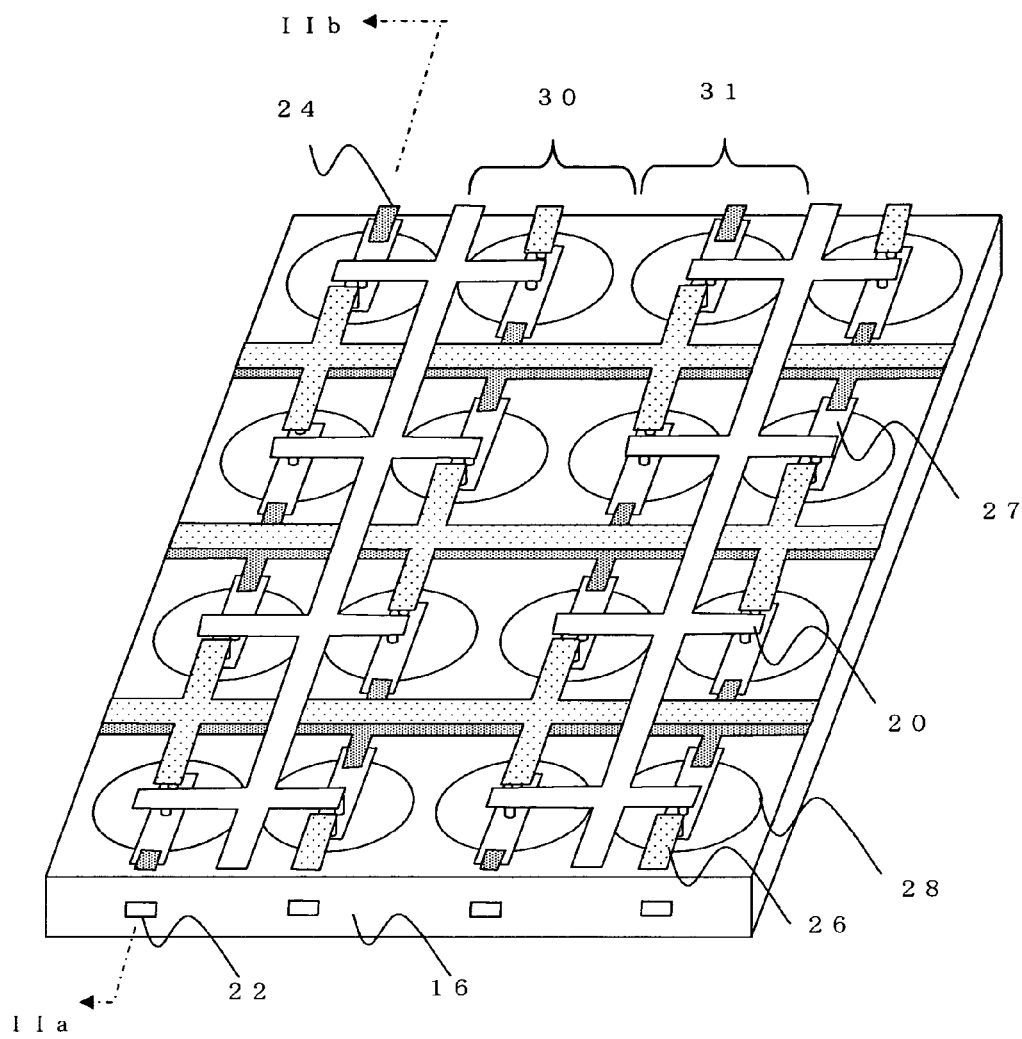
FIG. 3B is a diagram in which a plane configuration of electrodes is added to FIG. 3A.

FIG. 3A shows a perspective view of a plurality of such piezoelectric transformers connected in parallel, and FIG. 3B is a perspective view of the piezoelectric transformers of FIG. 3A to which individual electrodes are added. As shown in FIGS. 3A and 3B, a plurality of the piezoelectric transformers described with FIG. 2B are arranged in the row and column directions in the plane of the supporting substrate 16. As is clear from FIG. 3A, the parallel-connected piezoelectric transformers are arranged so that each of the positions of the end portions of the left electrodes 6 of the piezoelectric substrates 27 fixed to each of the insulating layers 17 is alternately positioned with respect to its adjacent piezoelectric transformers. Namely, a piezoelectric transformer 31 that is adjacent to a piezoelectric transformer 30 in the row direction is arranged so that it is rotated by 180 degrees with respect to the piezoelectric transformer 30. The same relationship also applies in the column direction.

As shown in FIG. 3B, in the piezoelectric transformers 30 and 31 adjacent to one another in the row direction, the lower electrodes 22 extend in the column direction in the supporting substrate 16, so as to connect a plurality of piezoelectric transformers 30 or piezoelectric transformers 31 arranged in the column direction. Referring to FIGS. 2A and 2B as well, the piezoelectric substrates 27 of the piezoelectric transformers 30 and 31 adjacent to each other in the row direction are connected via the lower electrode 16 or the upper electrode wire 20 that connects the piezoelectric transformers 30 and 31 arranged in the column direction collectively. Meanwhile, the piezoelectric substrates 27 of the piezoelectric transformers that are adjacent to each other in the column direction are connected via the right electrode wire 26 or the left electrode wire 24 that connects the piezoelectric transformers arranged in the row direction collectively. With this structure, by applying a voltage between the cross right electrode wire 26 or left electrode wire 24 and the upper electrode wire 20 or the lower electrode 16 that cross the wires 26 and 24, it becomes possible to gain access to an arbitrary set (pair) of piezoelectric transformers 30 and 31. Note that, upon access, four piezoelectric transformers adjacent to one another in the row and column directions are operated. While it goes without saying that more piezoelectric transformers can be operated by applying a voltage to the electrodes, operation is based on a set of four piezoelectric transformers.

Figure 4A:
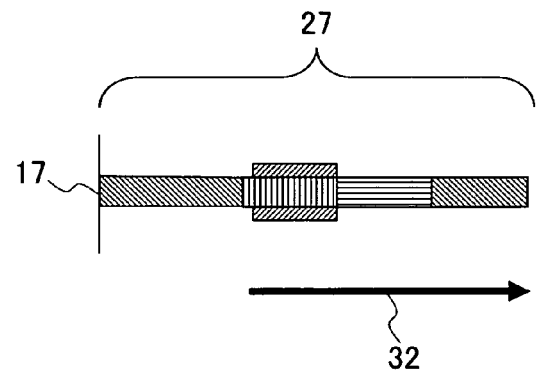
FIG. 4A shows a side view of a main part and FIG. 4B shows a perspective view.

FIG. 4 schematically shows vibration directions of the piezoelectric transformer connected in parallel. As shown in FIG. 4A, the piezoelectric substrate 27 vibrates in a vibration direction 32 since an end portion thereof is fixed to the insulating layer 17, and the other end portion thereof is set free.

Figure 4B:
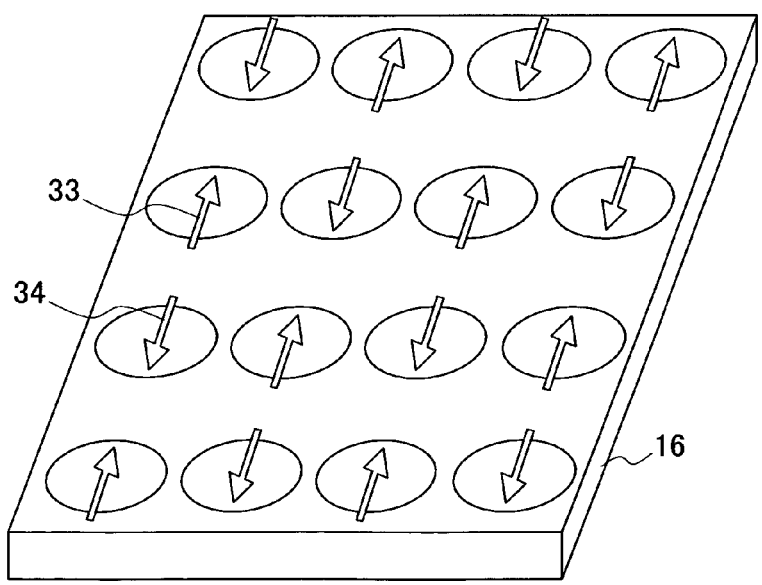
Figure 5:
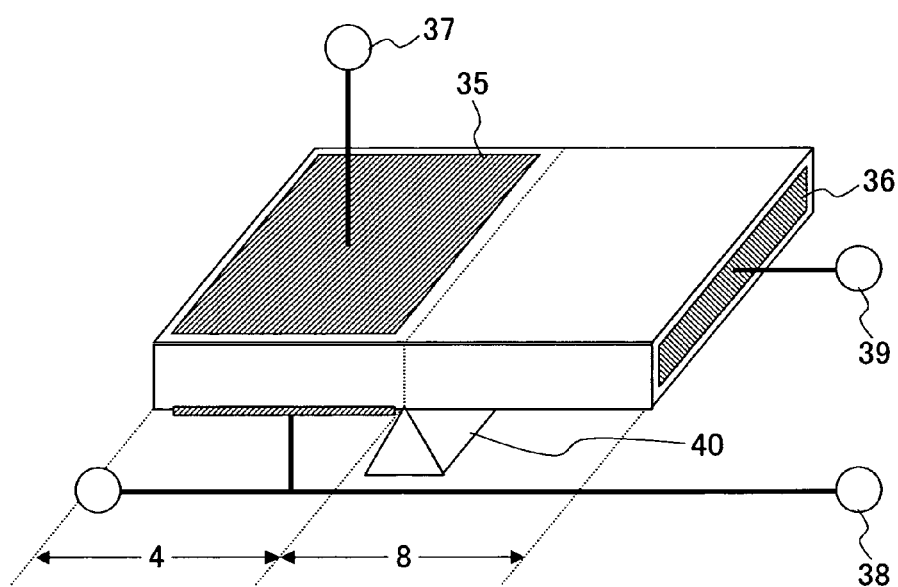
FIG. 5 shows a perspective view of a Rosen-type piezoelectric transformer.

FIG. 4B shows a diagram of the vibration direction 32 of each of the parallel-connected piezoelectric transformers according to the present embodiment. In the supporting substrate 16, by alternatively arranging a piezoelectric transformer 33 having the vibration direction 32 from the front side to the back side of the diagram and the piezoelectric transformer 34 having the vibration direction 32 that is rotated by 180 degrees with respect to that of the piezoelectric transformer 33, influence of vibration of the substrate associated with vibration of the piezoelectric transformers is cancelled, thereby improving reliability of the device and reducing vibration damage. These piezoelectric transformers are connected in parallel and individual piezoelectric transformers are synchronized by a synchronous circuit, so that a large-capacity electric power of a desired voltage is outputted.

Embodiment 1

In embodiment 1, a piezoelectric thin film deposited on a silicon semiconductor is patterned into a desired shape. Transformers including such patterned piezoelectric thin films are alternately arranged in parallel so that vibration of the transformers is cancelled out with each other. Lead zirconate titanate ($k_{31}$=0.35, $k_{33}$=0.65, Qm=about 2000) was used as the piezoelectric material. Each of the piezoelectric transformers was designed to have a length of 2 mm and a width of 1 mm, 10 pieces×10 pieces of them are arranged on the silicon substrate (the total chip area: 30 mm×20 mm), and the individual piezoelectric transformers are connected in parallel. As a result of such prototype, a piezoelectric transformer having a step-down ratio of 0.1 and an output power of 50 W was realized.

As described above, a parallel-connected, large-capacity output transformer according to the present embodiment can provide a piezoelectric transformer that can be made smaller and thinner than a conventional transformer utilizing an electromagnet coil. Further, a parallel-connected piezoelectric transformer capable of realizing large-capacity output can be provided. Furthermore, since manufacturing process can be made simpler and material cost can be kept lower, a low-cost manufacturing method for piezoelectric transformers can be provided, compared with a conventional method for manufacturing piezoelectric transformers,.

The present invention can be utilized as a piezoelectric transformer.

What is claimed is:

1. A piezoelectric transformer comprising:
  a supporting substrate; and
  a piezoelectric body element formed on the surface of the supporting substrate, the piezoelectric body element having a piezoelectric body layer that expands or contracts in the thickness direction thereof when a voltage is applied thereto and that generates a voltage when a compressive force is applied thereto,
  wherein the piezoelectric body layer is formed on the surface of the supporting substrate, and the supporting substrate is provided with a first piezoelectric body element having a first vibration direction and a second piezoelectric body element having a second vibration direction that opposes the first vibration direction.

2. The piezoelectric transformer according to claim 1, wherein the first piezoelectric body element and the second piezoelectric body element are alternately provided in the plane of the supporting substrate.

3. The piezoelectric transformer according to claim 1, wherein the vibration direction of the piezoelectric body is opposite to that of an adjacent piezoelectric body.

4. The piezoelectric transformer according to claim 1, wherein the piezoelectric body element comprises a driving-portion side piezoelectric body layer and a power-generating portion side piezoelectric body layer connected to the driving-portion side piezoelectric body layer in a plane direction of the supporting substrate, and
  wherein the driving-portion side piezoelectric body layer is provided with an upper electrode and a lower electrode to which a voltage is applied in the thickness direction of the driving-portion side piezoelectric body layer, and the power-generating portion side piezoelectric body layer is provided with a left electrode and a right electrode on side surfaces in the direction that crosses the thickness direction of the power-generating portion side piezoelectric body layer.

5. The piezoelectric transformer according to claim 4, wherein one end of the right electrode or the left electrode is fixed to a side wall, and the other end thereof is set free without being supported on the side wall.

6. The piezoelectric transformer according to claim 1, wherein the piezoelectric body layer is a deposited film.

* * * * *